United States Patent
Suzuki et al.

(10) Patent No.: US 11,915,924 B2
(45) Date of Patent: Feb. 27, 2024

(54) SEMICONDUCTOR DEVICE AND METHOD FOR MANUFACTURING THE SAME

(71) Applicants: DENSO CORPORATION, Kariya (JP); KABUSHIKI KAISHA TOYOTA CHUO KENKYUSHO, Nagakute (JP)

(72) Inventors: Megumi Suzuki, Kariya (JP); Yasuo Yamamoto, Kariya (JP); Teruhisa Akashi, Nagakute (JP)

(73) Assignees: DENSO CORPORATION, Kariya (JP); KABUSHIKI KAISHA TOYOTA CHUO KENKYUSHO, Nagakute (JP)

( * ) Notice: Subject to any disclaimer, the term of this patent is extended or adjusted under 35 U.S.C. 154(b) by 490 days.

(21) Appl. No.: 17/030,874

(22) Filed: Sep. 24, 2020

(65) Prior Publication Data

US 2021/0035799 A1 Feb. 4, 2021

Related U.S. Application Data

(63) Continuation of application No. PCT/JP2019/017268, filed on Apr. 23, 2019.

(30) Foreign Application Priority Data

Apr. 24, 2018 (JP) ................................ 2018-083050
Mar. 22, 2019 (JP) ................................ 2019-055127

(51) Int. Cl.
*B81C 1/00* (2006.01)
*B81B 7/00* (2006.01)
(Continued)

(52) U.S. Cl.
CPC ...... *H01L 21/02164* (2013.01); *B81B 7/0035* (2013.01); *B81B 7/0061* (2013.01);
(Continued)

(58) Field of Classification Search
CPC ......... H01L 21/02164; H01L 21/31111; B81B 7/0035; B81B 7/0061; B81B 2201/02;
(Continued)

(56) References Cited

U.S. PATENT DOCUMENTS

| | | | |
|---|---|---|---|
| 2016/0003650 A1 | 1/2016 | Kanamaru et al. | |
| 2016/0137487 A1* | 5/2016 | Nicolas | B81C 1/00285 438/51 |
| 2016/0325984 A1* | 11/2016 | Dueweke | B81B 7/0051 |

OTHER PUBLICATIONS

Tomasz Grzebyk, Krzysztof Turczyk, Piotr Szyszka, Anna Górecka-Drzazga, Jan Dziuban, Pressure control system for vacuum MEMS, Vacuum, vol. 178 (Year: 2020).*

(Continued)

*Primary Examiner* — Brigitte A Paterson
(74) *Attorney, Agent, or Firm* — POSZ LAW GROUP, PLC

(57) ABSTRACT

A recess is formed in one silicon substrate. A silicon oxide film is formed in another one silicon substrate at a portion space apart from a space-to-be-formed region. The silicon oxide film has a groove surrounding the space-to-be-formed region and extending to an outer periphery of the other one silicon substrate. Further, the other one silicon substrate and the one silicon substrate are directly bonded to each other via the silicon oxide film so as to cover the groove. A gas discharge passage, a stacking structure of the silicon substrates and the silicon oxide film are formed, and the space is formed inside the stacking structure by the recess. Then, by the heat treatment, the gas inside the space is discharged to the outside of the stacking structure through the gas discharge passage.

7 Claims, 11 Drawing Sheets

(51) Int. Cl.
    *H01L 21/02*     (2006.01)
    *H01L 23/08*     (2006.01)
    *H01L 23/10*     (2006.01)
    *H01L 21/311*     (2006.01)
    *H01L 29/84*     (2006.01)
    *G01P 15/08*     (2006.01)
    *G01P 15/125*     (2006.01)

(52) U.S. Cl.
    CPC ...... B81C 1/00293 (2013.01); B81C 1/00349 (2013.01); H01L 21/31111 (2013.01); H01L 23/08 (2013.01); H01L 23/10 (2013.01); H01L 29/84 (2013.01); *B81B 2201/02* (2013.01); *B81C 2201/019* (2013.01); *B81C 2203/03* (2013.01); *G01P 15/0802* (2013.01); *G01P 15/125* (2013.01)

(58) Field of Classification Search
    CPC ............ B81C 1/00293; B81C 1/00349; B81C 2201/019
    See application file for complete search history.

(56) References Cited

OTHER PUBLICATIONS

Helmenstine, WHat is a perfect vacuum? Is it possible? Jul. 17, 2021 downloaded Mar. 10, 2023 (Year: 2021).*

* cited by examiner

SEMICONDUCTOR DEVICE AND METHOD FOR MANUFACTURING THE SAME

CROSS REFERENCE TO RELATED APPLICATION

The present application is a continuation application of International Patent Application No. PCT/JP2019/017268 filed on Apr. 23, 2019, which designated the U.S. and claims the benefit of priority from Japanese Patent Applications No. 2018-083050 filed on Apr. 24, 2018 and No. 2019-055127 filed on Mar. 22, 2019. The entire disclosures of all of the above applications are incorporated herein by reference.

TECHNICAL FIELD

The present disclosure relates to relates to a method of manufacturing a semiconductor device having a space formed therein.

BACKGROUND

As a semiconductor device of this type, for example, an acceleration sensor is proposed such that a fixed electrode formed on a support substrate and a movable electrode which is displaceable with respect to the support substrate are arranged in an internal space, and the sensor detects acceleration based on the change in the electrostatic capacitance between electrodes when the movable electrode is displaced. Further, there is an angular velocity sensor that detects an angular velocity by vibrating a part of the substrate as a deformable movable portion in an internal space and by detecting a displacement amount of the movable portion when the angular velocity is applied.

SUMMARY

A recess is formed in one silicon substrate. A silicon oxide film is formed in another one silicon substrate at a portion space apart from a space-to-be-formed region. The silicon oxide film has a groove surrounding the space-to-be-formed region and extending to an outer periphery of the other one silicon substrate. Further, the other one silicon substrate and the one silicon substrate are directly bonded to each other via the silicon oxide film so as to cover the groove. A gas discharge passage, a stacking structure of the silicon substrates and the silicon oxide film are formed, and the space is formed inside the stacking structure by the recess. Then, by the heat treatment, the gas inside the space is discharged to the outside of the stacking structure through the gas discharge passage.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
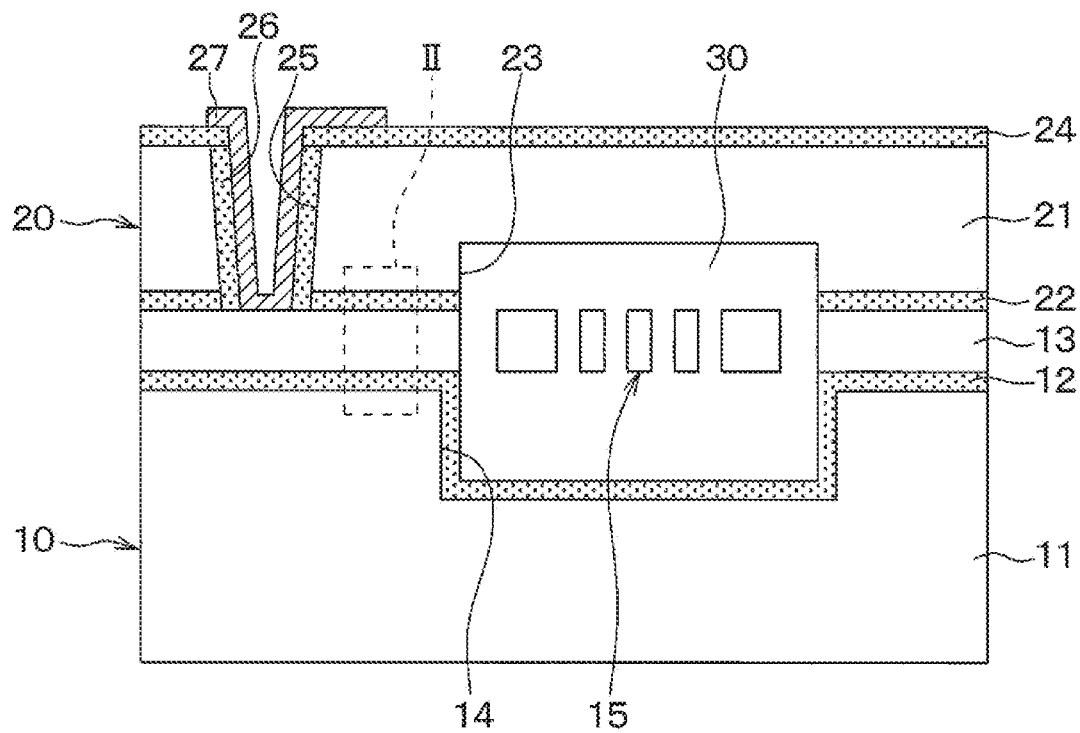
FIG. 1 is a cross-sectional view of a semiconductor device according to a first embodiment.

In order to improve the performance of sensors, it is important to set the pressure in the space where the movable electrode and the like are arranged to be a pressure suitable for the usage application.

Regarding this, for example, a comparison technique proposes a method of suppressing the pressure variation due to the residual gas attributed to the manufacturing process by widening the internal space.

However, in the method described above, since the gas remains in the internal space, it is difficult to make the internal space to be a low pressure such as 100 Pa or less, for example, about 10 Pa.

In view of the above points, the present embodiments have an object to provide a semiconductor device and a method for manufacturing a semiconductor device that can make the internal space at a lower pressure than the comparison technique.

One aspect of the present embodiments is a method for manufacturing a semiconductor device having a space (30) formed therein, which comprises preparing a plurality of silicon substrates (11, 13, 21) and forming a recess (14, 23) in at least one of the plurality of silicon substrates, and forming a silicon oxide film (12, 22) at a portion distant from a space-to-be-formed region in at least one of the plurality of silicon substrates such that the film has a groove (17, 28) surrounding the space-to-be-formed region and reaching an outer periphery of the plurality of silicon substrates; bonding directly one of the silicon substrates on which the silicon oxide film is formed and another one of the silicon substrates via the silicon oxide film so as to cover the groove; forming a gas discharge passage (40) and forming a stacking structure of the plurality of silicon substrates and the silicon oxide film; forming a space inside the stacking structure by the recess; and discharging a gas inside the space to an outside of the stacking structure through the gas discharge passage by heat treatment after forming the space.

According to this, after the substrates are bonded to each other to form the stacking structure and the space inside the stacking structure, the gas inside the space is discharged to the outside of the stacking structure through the gas discharge passage, so that the pressure in the internal space is made lower than conventional. Then, by such a manufacturing method, the stacking structure including the support layer, the first silicon oxide film, the activation layer, the second silicon oxide film, and the cap layer is formed, and the semiconductor device having the element portion in the space is manufactured. In such a semiconductor device, the residual gas is discharged through the gas discharge passage, and thus the performance of the semiconductor device can be improved.

A reference numeral in parentheses attached to each configuration element or the like indicates an example of correspondence between the configuration element or the like and the specific configuration element or the like described in embodiments below.

Hereinafter, embodiments of the present disclosure will be described with reference to the drawings. In each embodiment described below, same or equivalent parts are designated with the same reference numerals.

First Embodiment

A first embodiment will be described. The semiconductor device of the present embodiment is a physical quantity sensor manufactured using MEMS (Micro Electro Mechanical Systems), and as shown in FIG. 1, the device includes a sensor unit 10, and a cap portion 20 directly boded to the sensor portion 10.

The sensor unit 10 has an SOI (Silicon) structure such that a support layer 11 made of silicon (i.e., Si), an insulation layer 12 made of a silicon oxide film (i.e., $SiO_2$) and an activation layer 13 made of Si are sequentially stacked. The support layer 11 is electrically insulated from the activation layer 13 by the insulation layer 12.

A recess 14 is formed on the surface of the support layer 11, and the insulation layer 12 is formed so as to cover the surface of the support layer 11 and the inner wall surface of the recess 14. The activation layer 13 is bonded to the surface of the support layer 11 by a surface activation bonding via the insulation layer 12. As described above, the sensor unit 10 of the present embodiment has a cavity SOI structure in which a space is formed between the support layer 11 and the insulation layer 12 and the activation layer 13.

A part of the activation layer 13 located above the recess 14 is partially removed, and the remaining part of the layer 13 provides an element portion 15. The element portion 15 is displaceable with respect to the portion of the activation layer 13 bonded to the support layer 11.

For example, the semiconductor device can be used as an acceleration sensor to be configured to have a structure in which a movable electrode is formed in the element portion 15 and a fixed electrode is formed in the insulation layer 12 formed in the recess 14 or in the recess 23 described later to detect a change in a capacitance between these electrodes. Further, the semiconductor device can be used as an angular velocity sensor to be configured to have a structure in which the element portion 15 is vibrated so that the displacement amount of the element portion 15 is detected when the angular velocity is applied to the element portion 15.

The cap portion 20 protects the element portion 15, and includes a substrate 21 made of Si. An insulation layer 22 made of $SiO_2$ is formed on the back surface of the substrate 21. The substrate 21 is bonded to the activation layer 13 by a surface activation bonding method via the insulation layer 22. The activation layer 13 and the substrate 21 are electrically insulated by the insulation layer 22.

In the portion of the cap portion 20 facing the recess 14, a part of the insulation layer 22 and a part of the substrate 21 are removed to form a recess 23. Inside the semiconductor device, a space 30 is formed by the recess 14 and the recess 23, and the element portion 15 is arranged in the space 30.

Figure 2:
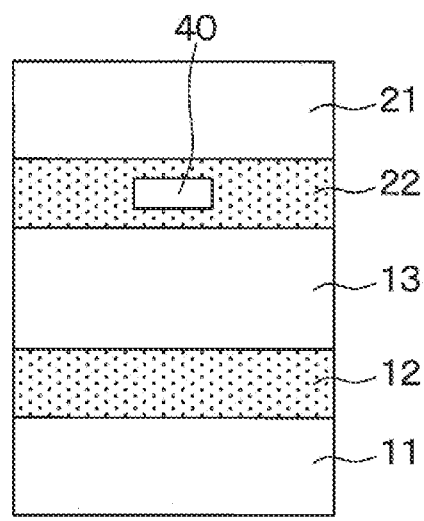
FIG. 2 is an enlarged view of a portion II in FIG. 1.

As shown in FIG. 2, a gas discharge passage 40 is formed in a portion of the insulation layer 22 outside the space 30. The gas discharge passage 40 discharges the gas in the space 30 to the outside of the semiconductor device, and is formed so as to surround the space 30 and to communicate with the outside of the semiconductor device.

As shown in FIG. 1, the cap portion 20 is formed with a through electrode for applying an electric signal to the element portion 15 and for acquiring the output of the element portion 15.

Specifically, an insulation film 24 is formed on the surface of the substrate 21, and a through hole 25 penetrating the substrate 21, the insulation layer 22, and the insulation film 24 is formed in a portion of the cap portion 20 outside the space 30. An insulation film 26 is formed on the inner wall surface of the through hole 25. A part of the insulation film 26 is removed at the bottom of the through hole 25, and the electrode film 27 is formed so as to cover the surface of the activation layer 13 exposed from the insulation film 26 and the surface of the insulation film 26 and to reach the upper part of the insulation film 24.

The electrode film 27 is electrically connected to the element portion 15, and it is possible to apply an electric signal to the element portion 15 via the electrode film 27 and to obtain the output of the element portion 15. Although only one through electrode is shown in FIG. 1, the cap portion 20 may be formed with a plurality of through electrode having the number of electrodes necessary for functioning the element portion 15.

Figure 3A:
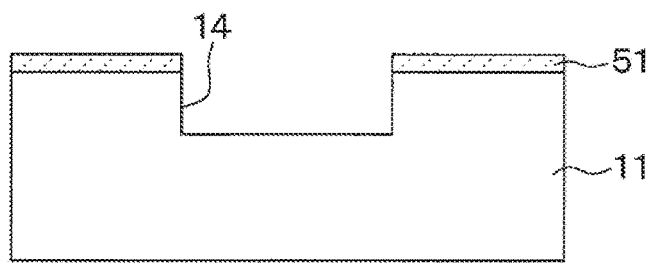
FIG. 3A is a cross-sectional view showing the manufacturing process of the sensor unit.

A method of manufacturing a semiconductor device will be described. First, a method of manufacturing the sensor unit 10 will be described with reference to FIGS. 3A to 3E. In the step shown in FIG. 3A, a Si wafer forming the support layer 11 is prepared, and a resist 51 having a shape corresponding to the recess 14 is formed on the surface of the support layer 11 by using photolithography. Then, a part of the support layer 11 is removed by DRIE (Deep Reactive Ion Etching) using the resist 51 as a mask to form the recess 14.

Figure 3B:
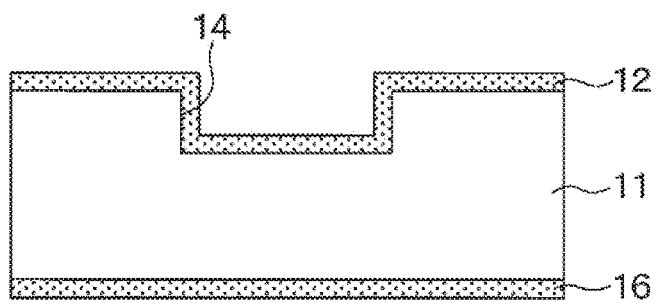
FIG. 3B is a cross-sectional view showing the manufacturing process of the sensor unit, following FIG. 3A.

In the step shown in FIG. 3B, the resist 51 is removed by ashing and the wafer is washed. Then, the support layer 11 is thermally oxidized to form the insulation layer 12 made of $SiO_2$ on the surface of the support layer 11 and to form the insulation film 16 made of $SiO_2$ on the back surface of the support layer 11.

Figure 3C:
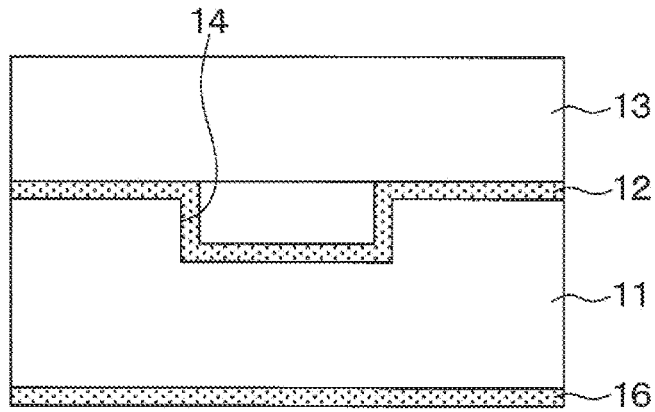
FIG. 3C is a cross-sectional view showing the manufacturing process of the sensor unit, following FIG. 3B.

In the step shown in FIG. 3C, a Si wafer that constitutes the activation layer 13 is prepared, and the support layer 11 and the activation layer 13 are bonded together by a surface activation bonding process. Specifically, after activating the bonding surfaces of the support layer 11 and the activation layer 13 by oxygen plasma, the support layer 11 and the activation layer 13 are exposed to the atmosphere to absorb moisture in the atmosphere on the bonding surfaces of the support layer 11 and the activation layer 13, so that the OH group is modified. Then, the support layer 11 and the activation layer 13 are bonded together. Note that the bonding strength can be increased by performing heat treatment as needed.

Figure 3D:
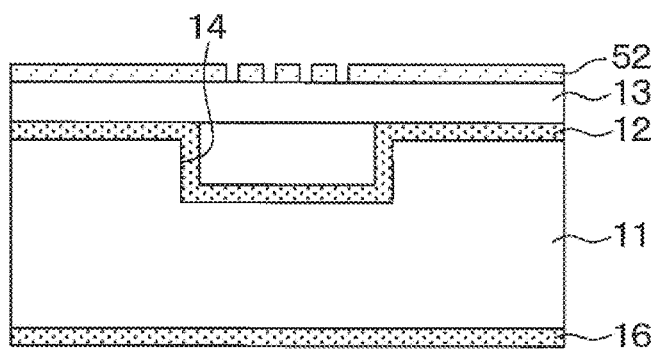
FIG. 3D is a cross-sectional view showing the manufacturing process of the sensor unit, following FIG. 3C.

In the step shown in FIG. 3D, the activation layer 13 is polished and thinned, and then the wafer is washed. Then, a resist 52 having a shape corresponding to the element portion 15 is formed on the surface of the activation layer 13 by photolithography.

Figure 3E:
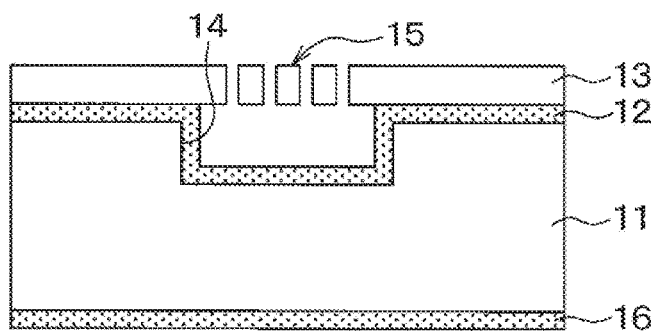
FIG. 3E is a cross-sectional view showing the manufacturing process of the sensor unit, following FIG. 3D.

In the step shown in FIG. 3E, a part of the activation layer 13 is removed by DRIE using the resist 52 as a mask. Then, the resist 52 is removed by ashing and the wafer is washed. As a result, the element portion 15 is formed in the portion of the activation layer 13 located above the recess 14.

Next, a method of manufacturing the cap portion 20 will be described with reference to FIGS. 4A to 4E. In the step shown in FIG. 4A, a Si wafer that constitutes the substrate 21 is prepared, the substrate 21 is thermally oxidized to form an insulation layer 22 made of $SiO_2$ on the back surface of the substrate 21, and an insulation film 24 made of $SiO_2$ is formed on the front surface of the substrate 21. After that, a resist 53 having a shape corresponding to the gas discharge passage 40 is formed on the insulation layer 22 by photolithography. Then, a part of the insulation layer 22 is removed by RIE (Reactive Ion Etching) using the resist 53 as a mask to form the groove 28. The groove 28 is formed over the entire surface of the wafer so as to surround the region where the recess 23 is to be formed and to reach the outer periphery of the wafer.

Figure 4A:
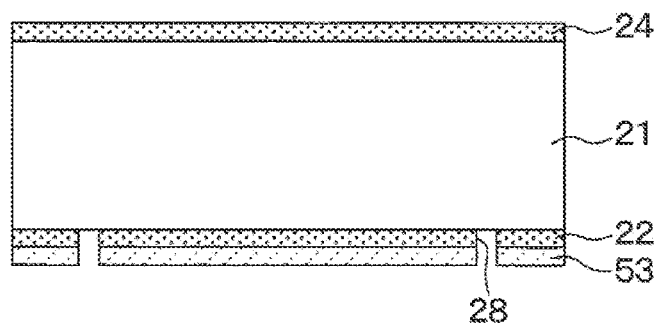
FIG. 4A is a cross-sectional view showing the manufacturing process of the cap portion.
Figure 4B:
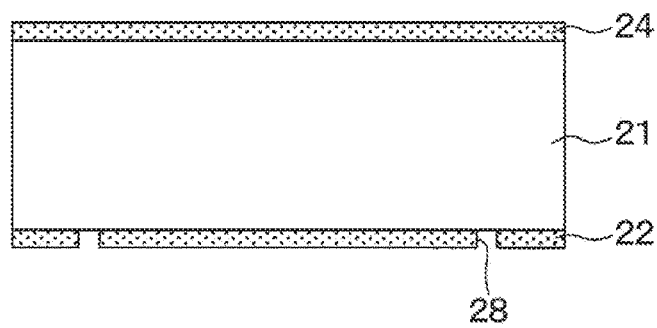
FIG. 4B is a cross-sectional view showing the manufacturing process of the cap portion, following FIG. 4A.
Figure 4C:
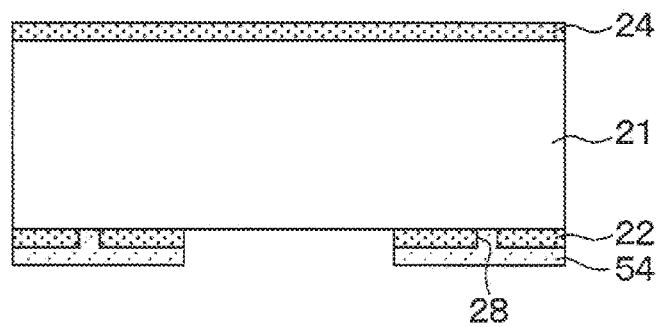
FIG. 4C is a cross-sectional view showing the manufacturing process of the cap portion, following FIG. 4B.

In the step shown in FIG. 4B, the resist 53 is removed by oxygen ashing and the wafer is washed. As a result, the insulation layer 22 is exposed. In the step shown in FIG. 4C, a resist 54 having a shape corresponding to the recess 23 is formed on the insulation layer 22 by photolithography. Then, a part of the insulation layer 22 is removed by etching using the resist 54 as a mask. As a result, a part of the substrate 21 is exposed.

Figure 4D:
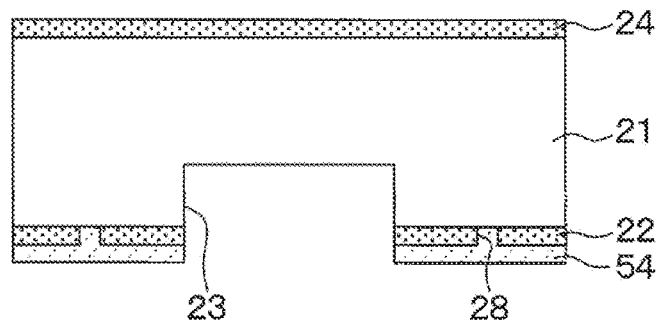
FIG. 4D is a cross-sectional view showing the manufacturing process of the cap portion, following FIG. 4C.
Figure 4E:
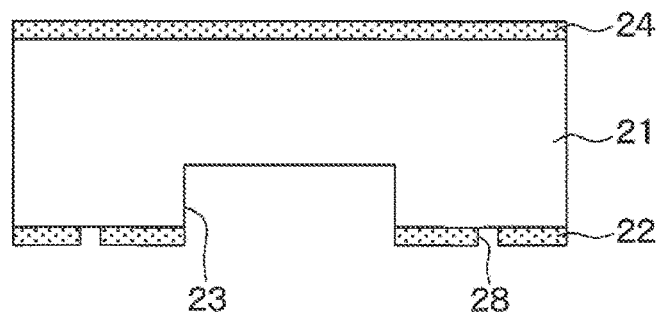
FIG. 4E is a cross-sectional view showing the manufacturing process of the cap portion, following FIG. 4D.

In the step shown in FIG. 4D, a part of the substrate 21 is removed by DRIE using the resist 54 as a mask to form the recess 23. In the step shown in FIG. 4E, the resist 54 is removed by oxygen ashing and the wafer is washed. As a result, the insulation layer 22 is exposed.

Figure 5:
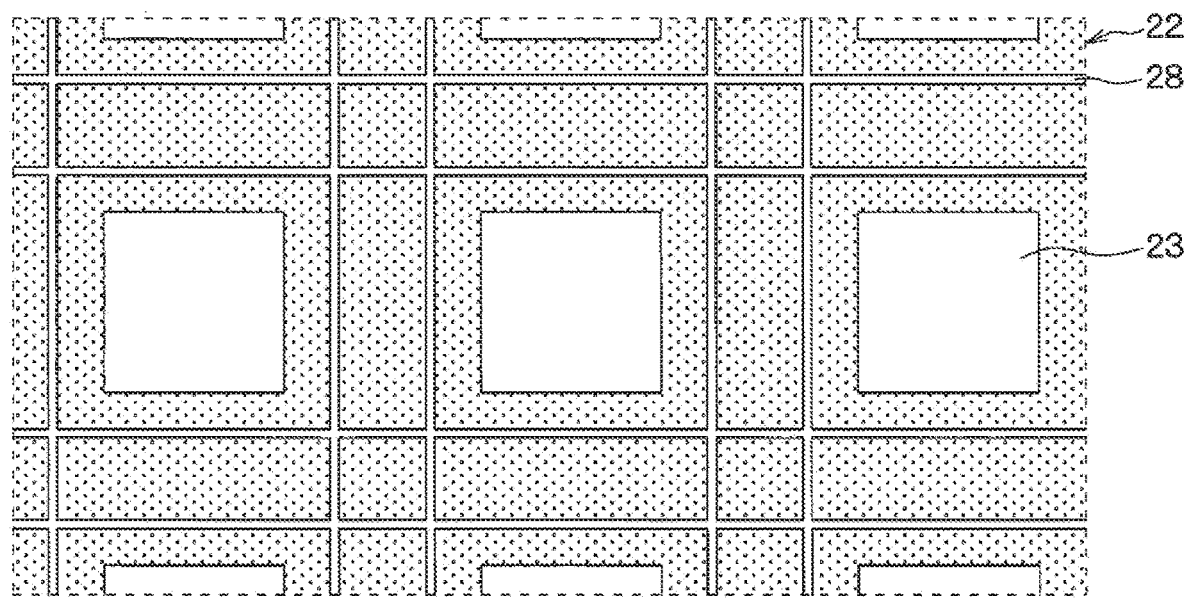
FIG. 5 is a plan view of an insulation layer.

A plan view of the insulation layer 22 after the resist 54 is removed is shown in FIG. 5. That is, the plurality of recesses 23 are arranged in a grid pattern, and the grooves 28 are formed so as to surround the periphery of each recess 23. In the present embodiment, two linear grooves 28 are formed between two adjacent recesses 23.

Figure 6A:
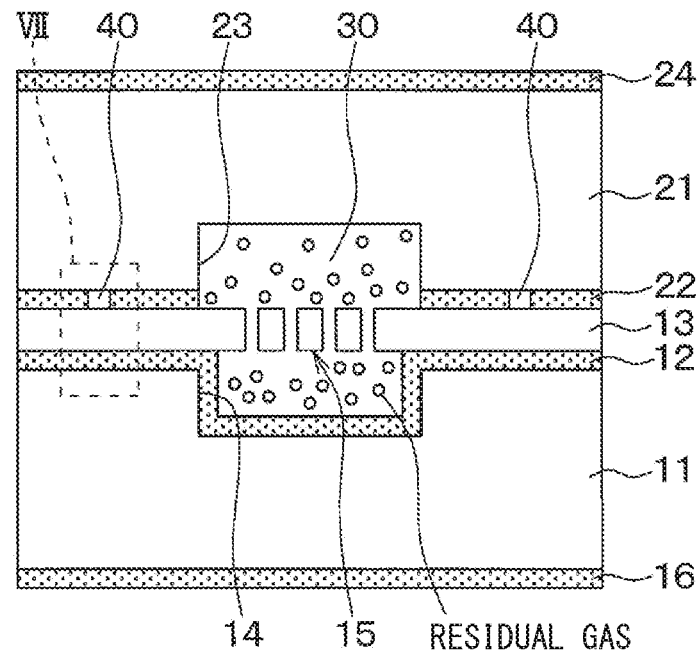
FIG. 6A is a cross-sectional view showing a bonding process.
Figure 6B:
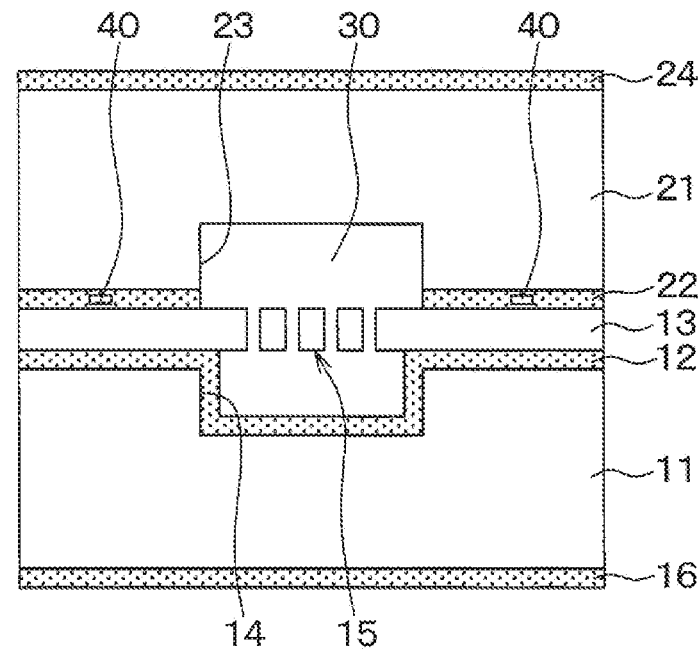
FIG. 6B is a cross-sectional view showing the bonding process subsequent to FIG. 6A.

After the steps shown in FIGS. 3A to 3E and FIGS. 4A to 4E, the sensor unit 10 and the cap portion 20 are bonded by the steps shown in FIGS. 6A and 6B. In the process shown in FIG. 6A, WLP (Wafer Level Packaging) is performed. Specifically, the activation layer 13 and the insulation layer 22 are bonded by surface activation bonding in vacuum. As a result, a space 30 surrounded by the recess 14 and the recess 23 is formed, and the element portion 15 is sealed in the space 30.

When the surface activation treatment is performed, moisture and nitrogen in the atmosphere are adsorbed on the wafer surface after exposure to the atmosphere. When heat treatment is performed after bonding, the adsorbed water is decomposed into hydrogen and oxygen, oxygen is taken into the oxide film, and hydrogen remains in the space 30. Further, nitrogen is released from the inner wall surface of the space 30 by heat treatment and is released into the space 30. In this way, the residual gas including hydrogen, nitrogen, etc. due to the manufacturing process is sealed in the space 30.

Figure 7:
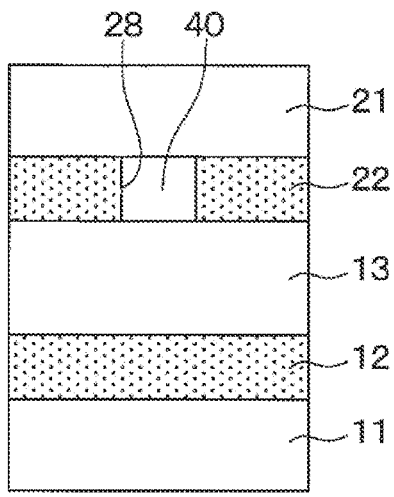
FIG. 7 is an enlarged view of portion VII of FIG. 6A.

Further, in the step shown in FIG. 6A, as shown in FIG. 7, the groove 28 is covered with the activation layer 13, and a fine void surrounded by the activation layer 13, the substrate 21, and the insulation layer 22 is provided outside the space 30. This void serves as a gas discharge passage 40 for discharging the residual gas.

In the step shown in FIG. 6B, the gas components inside or near the wall surface of the space 30 are activated by high-temperature annealing in a nitrogen atmosphere and so that the gas components are separated from the wall surface of the space 30. After that, the high-temperature annealing in a nitrogen atmosphere is continued to activate the residual gas and to move the gas to the gas discharge passage 40 along the bonding boundary between Si and $SiO_2$ having the lowest energy barrier. The residual gas reached to the gas discharge passage 40 is exhausted to the outside of the wafer through the gas discharge passage 40. As a result, the pressure in the space 30 is lowered, and the inside of the space 30 becomes a high vacuum. The discharge amount of residual gas can be controlled by the heat treatment conditions.

After that, annealing is performed in an oxygen atmosphere to form an oxide film on the activation layer 13 and the substrate 21 exposed in the gas discharge passage 40 by the oxygen gas inside the wafer. As a result, the gas discharge passage 40 is closed as shown in FIG. 2, and the inflow of gas from the outside is restricted. Here, the state that the gas discharge passage 40 is closed may mean that the gas discharge passage 40 is partly and completely sealed. Alternatively, the state means that the activation layer 13 and the substrate 21 are not exposed to the gas discharge passage 40, but these exposed surfaces of them are covered with the insulation layer 22. In other words, the gas discharge passage 40 is formed at a position spaced away from the activation layer 13 and the substrate 21. Therefore, even after the gas discharge passage 40 is closed, the gas discharge passage 40 can be confirmed by performing an infrared microscope observation or an electron microscope observation. Furthermore, although the wafer is finally divided into chips by dicing cut process, it may not be possible that the gas discharge passage 40 may be visible to the bare eye since silicon or glass fragments enter the gas discharge passage 40 at the cross-sectional surface. Even in that case, the gas discharge passage 40 can be confirmed by observation with an infrared microscope or an electron microscope. That is, even after the dicing cut process, the gas discharge passage 40 is formed so as to reach the outer circumference of the substrate 21 and the like.

After closing the gas discharge passage 40, the insulation film 16 is removed by an etching process. Further, a through-hole electrode is formed in the cap portion 20. Specifically, a resist having a shape corresponding to the through hole 25 is formed on the surface of the insulation film 24, and the through hole 25 penetrating the substrate 21, the insulation layer 22, and the insulation film 24 is formed by etching using the resist as a mask. Then, after forming the insulation film 26 on the inner wall surface of the through hole 25 by thermal oxidation, the insulation film 26 formed at the bottom of the through hole 25 is removed by etching to expose the activation layer 13. After that, the electrode film 27 is formed by sputtering or the like so as to cover the activation layer 13 and the insulation film 26 and to reach the upper part of the insulation film 24. As a result, a through-hole electrode is formed, and it becomes possible to apply a signal to the element portion 15.

After removing the insulation film 16 and forming the through-hole electrode, a dicing cut process is performed to divide the wafer into chips. In this manner, a semiconductor device is manufactured.

As described above, in the present embodiment, the gas discharge passage 40 for discharging the residual gas in the space 30 is formed, and the heat treatment is performed after the sensor portion 10 and the cap portion 20 are bonded to each other. The residual gas can be discharged to the outside of the wafer, and the space 30 can be in a high vacuum. Further, it is possible to suppress the pressure fluctuation due to the release of the gas adsorbed on the inner wall surface of the space 30.

Further, by controlling the discharge amount of the residual gas according to the heat treatment conditions, the inside of the space 30 can be set to a desired pressure and the performance of the semiconductor device can be improved. For example, in an acceleration sensor, an angular velocity sensor, etc., the sensitivity can be improved.

Further, by closing the gas discharge passage 40 after discharging the residual gas, the inflow and outflow of gas can be suppressed, and the internal pressure can be stably maintained for a long period of time. As a result, the performance of the semiconductor device can be stabilized for a long period of time.

On the other hand, since the residual gas can be discharged to the outside of the wafer through the gas discharge passage 40 of FIG. 7, annealing in an oxygen atmosphere may be carried out as necessary, and the gas discharge passage 40 of FIG. 7 having the same effect as that of the gas discharge passage 40 of FIG. 2 can be obtained. In that case, the cap portion 20 and the activation layer 13 are exposed at the position where the gas discharge passage 40 is formed, and the cap portion 20, the activation layer 13, and the insulation layer 22 constitute the gas discharge passage 40.

Further, in this embodiment, since the getter film is not used to remove the residual gas, the manufacturing cost of the semiconductor device can be reduced as compared with the case where the getter film is used.

Figure 8:
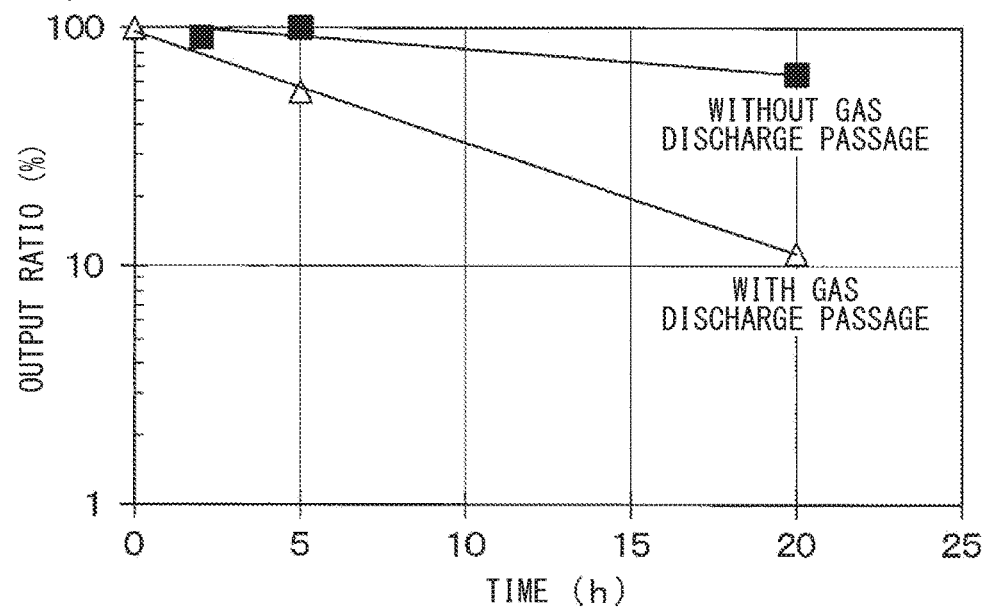
FIG. 8 is a diagram showing the results of an experimental examination of the discharge efficiency of residual gas in the space with and without a gas discharge passage.

Through experiments, the presence or absence of the gas discharge passage 40 and the discharge efficiency of the residual gas in the space 30 are examined. As a result, the result shown in FIG. 8 is obtained. In this experiment, the change in pressure in the space 30 is examined by performing the anneal at a temperature of 1050 oC for a maximum of 20 hours. Regarding the pressure ratio in the drawing, the case where the internal pressure in the space 30 is the highest is defined as 100%, and is shown as the ratio to the pressure at that time.

As shown in this drawing, when the gas discharge passage 40 is arranged, the rate of pressure decrease is high, and the pressure can be reduced to about 10 percent compared to a case before annealing. From this, it is determined that the residual gas can be accurately discharged. The pressure in the space 30 after annealing at 1050 oC for 20 hours is 94 Pa. Therefore, by arranging the gas discharge passage 40, the pressure in the space 30 can be 100 Pa or less, and a high vacuum state can be obtained. When the pressure in the space 30 can be set to 100 Pa or less, the Q value when detecting the physical quantity in the element portion 15 becomes higher than 5000, which is about one digit higher than the Q value in a case where the pressure exceeds 100 Pa. For this reason, it is possible to improve the vibration characteristics of the element portion 15 and to reduce the leakage vibration (i.e., noise), so that it is possible to detect the physical quantity with high accuracy.

On the other hand, when the gas discharge passage 40 is not provided, the rate of pressure decrease is low, and there is little change in pressure even when annealing is performed. From this, it is determined that the residual gas can not be properly discharged. As described above, when the gas discharge passage 40 is not provided, the residual gas cannot be discharged sufficiently. Therefore, it becomes difficult to perform accurate physical quantity detection.

In the case where the gas discharge passage 40 is not provided, the pressure in the space 30 is highest when the annealing is performed for 5 hours, so that the pressure at this time is defined as 100%, and the pressure ratio is shown. When the residual gas is appropriately discharged by performing the annealing, the pressure becomes the highest before the annealing. However, when the gas discharge passage 40 is not arranged, the residual gas is not sufficiently discharged, so that the pressure fluctuation is little, and it is considered that such an error has occurred.

Second Embodiment

A second embodiment will be described next. The present embodiment is different from the first embodiment in the configuration of the cap portion 20 and the other configurations are similar to the first embodiment, so only the difference from the first embodiment will be described.

Figure 9:
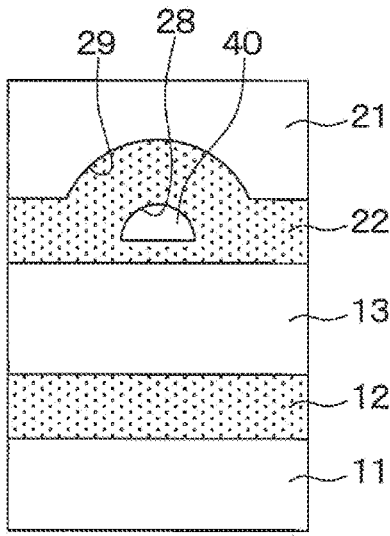
FIG. 9 is a cross-sectional view of the semiconductor device according to the second embodiment and is a view corresponding to FIG. 2.

As shown in FIG. 9, in the present embodiment, the substrate 21 is provided with the groove 29 having a semicircular cross section and serving as a base. The insulation layer 22 is formed on the back surface of the substrate 21 and inside the groove 29, and the shape of the groove 29 is reflected in the insulation layer 22 formed in the groove 29 to form a groove 28 having a semicircular cross section.

In this embodiment, the cap portion 20 is manufactured by the steps shown in FIGS. 10A to 10E. In the step shown in FIG. 10A, a Si wafer that constitutes the substrate 21 is prepared, and a resist 55 having a shape corresponding to the gas discharging passage 40 is formed by photolithography on the back surface of the substrate 21 that is bonded to the sensor unit 10. Then, the groove 29 having a semicircular cross section is formed in the substrate 21 by isotropic etching using the resist 55 as a mask. The groove 29 is formed so as to surround the region where the recess 23 is to be formed and to reach the outer periphery of the substrate 21.

Figure 10A:
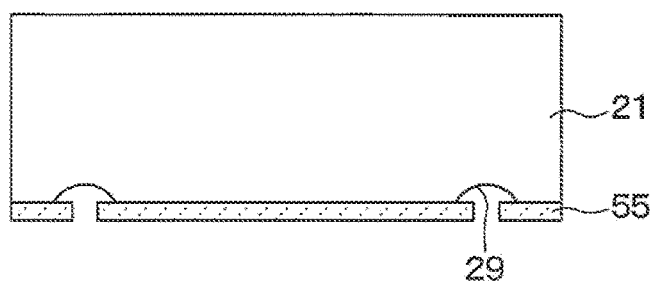
FIG. 10A is a cross-sectional view showing the manufacturing process of the cap portion in the second embodiment.
Figure 10B:
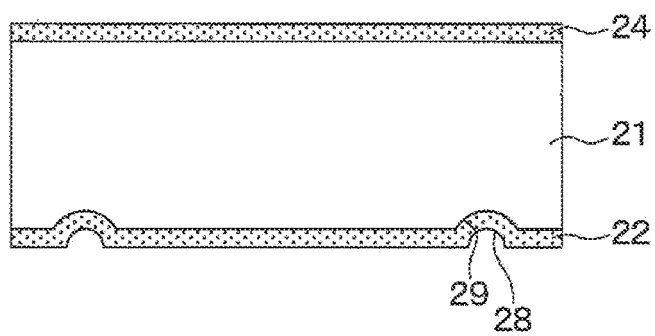
FIG. 10B is a cross-sectional view showing the manufacturing process of the cap portion, following FIG. 10A.

In the step shown in FIG. 10B, the resist 55 is removed by oxygen ashing and the wafer is washed to expose the back surface of the substrate 21. Then, the substrate 21 is thermally oxidized to form the insulation layer 22 made of $SiO_2$ on the back surface of the substrate 21 and inside the groove 29, and the insulation film 24 made of $SiO_2$ is formed on the surface of the substrate 21. At this time, the shape of the groove 29 is reflected in the insulation layer 22 formed inside the groove 29 to form the groove 28 having a semicircular cross section.

Figure 10C:
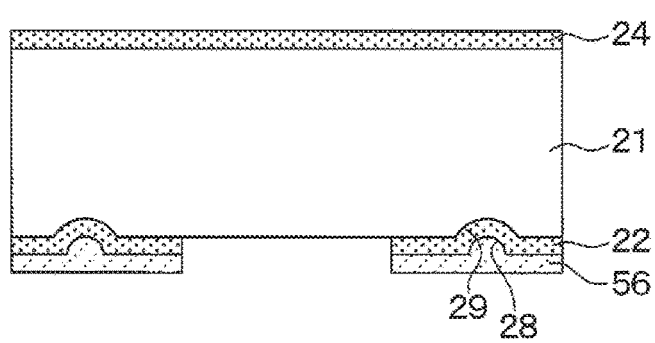
FIG. 10C is a cross-sectional view showing the manufacturing process of the cap portion, following FIG. 10B.

In the step shown in FIG. 10C, a resist 56 having a shape corresponding to the recess 23 is formed on the insulation layer 22 by photolithography. Then, a part of the insulation layer 22 is removed by RIE using the resist 56 as a mask. As a result, a part of the substrate 21 is exposed.

Figure 10D:
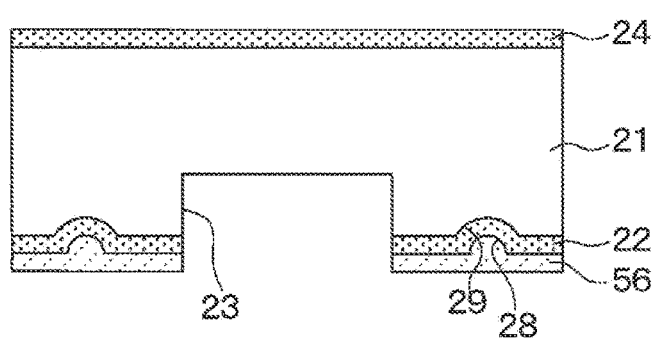
FIG. 10D is a cross-sectional view showing the manufacturing process of the cap portion, following FIG. 10C.

In the step shown in FIG. 10D, a part of the substrate 21 is removed by DRIE using the resist 56 as a mask to form the recess 23. In the step shown in FIG. 10, the resist 56 is removed by oxygen ashing and the wafer is washed. As a result, the insulation layer 22 is exposed.

Figure 10E:
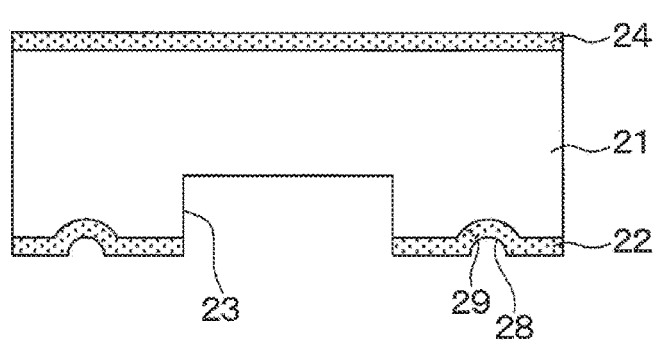
FIG. 10E is a cross-sectional view showing the manufacturing process of the cap portion, following FIG. 10D.

After the step shown in FIG. 10E, WLP is performed to bond the activation layer 13 and the insulation layer 22. Thereby, the space 30 is formed similarly to the first embodiment, and the element portion 15 and the residual gas are sealed in the space 30. Further, as shown in FIG. 11, a fine gas discharge passage 40 surrounded by the activation layer 13 and the insulation layer 22 is formed outside the space 30.

After bonding the activation layer 13 and the insulation layer 22, the residual gas in the space 30 is exhausted to the outside of the wafer through the gas discharging passage 40 as in the first embodiment. After that, annealing is performed in an oxygen atmosphere to form an oxide film on the activation layer 13 exposed in the gas discharge passage 40 by the oxygen gas inside the wafer. As a result, the gas discharge passage 40 is closed as shown in FIG. 9, and the inflow of gas from the outside is restricted.

In this embodiment, the groove 29 is formed in the substrate 21 and the gas discharge passage 40 is formed by the gap between the insulation layer 22 and the activation layer 13 formed in the groove 29, so that the same effect can be obtained similar to the first embodiment.

Figure 11:
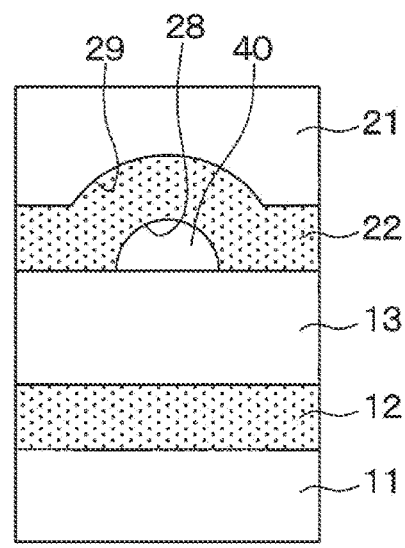
FIG. 11 is a cross-sectional view showing the manufacturing process of the semiconductor device according to the second embodiment, which is a diagram corresponding to FIG. 7.

On the other hand, since the residual gas can be discharged to the outside of the wafer through the gas discharge passage 40 of FIG. 11, annealing in an oxygen atmosphere may be carried out as necessary, and the gas discharge passage 40 of FIG. 11 having the same effect as that of the gas discharge passage 40 of FIG. 9 can be obtained.

Other Embodiments

Although the present disclosure is made with reference to the embodiments described above, the present disclosure is not limited to such embodiments but may include various changes and modifications which are within equivalent ranges. In addition, various combinations and forms, and further, other combinations and forms including only one element, or more or less than these elements are also within the sprit and the scope of the present disclosure.

Figure 12:
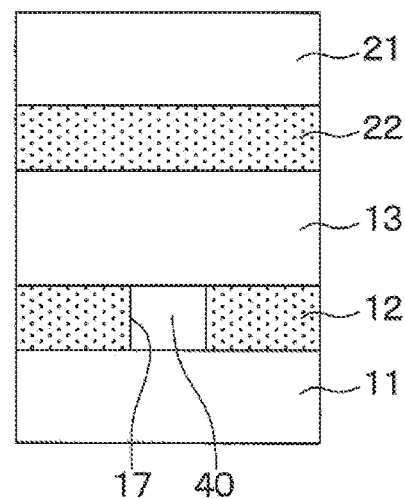
FIG. 12 is a cross-sectional view showing the manufacturing process of the semiconductor device in another embodiment, which is a diagram corresponding to FIG. 7.

For example, as shown in FIG. 12, a part of the insulation layer 12 is removed to form a groove 17, and a gas discharge passage 40 may be formed by a space surrounded by the support layer 11, the insulation layer 12, and the activation layer 13. In such a gas discharge passage 40, after the step shown in FIG. 3B, a portion of the insulation layer 12 corresponding to the gas discharge passage 40 is removed by photolithography and etching, and the insulation layer 12 is bonded to the activation layer 13 so as to form the passage 40. Here, even in the case of such a configuration, the surface of the activation layer 13 and the surface of the support layer 11 are covered with the insulation layer 12 by performing an annealing treatment in an oxygen atmosphere as necessary, so that the gas discharge passage 40 is formed at a position spaced apart from the support layer 11 and the activation layer 13.

Figure 13:
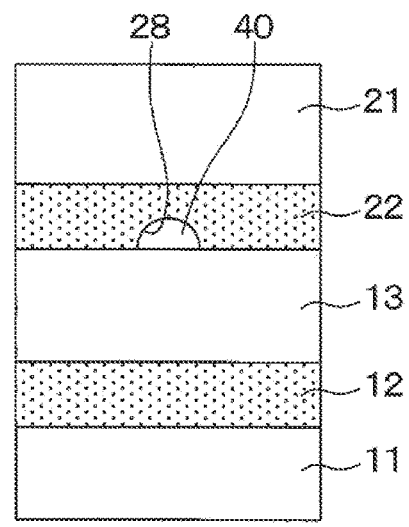
FIG. 13 is a cross-sectional view showing the manufacturing process of the semiconductor device according to another embodiment, which is a diagram corresponding to FIG. 7.

Further, in the first embodiment described above, the groove 28 is formed so as to penetrate the insulation layer 22, alternatively, as shown in FIG. 13, the gas discharge passage 40 may be formed by a hole surrounded by the insulation layer 22 and the activation layer 13 with forming the groove 28 at a depth which is disposed in the middle of the insulation layer 22 in the thickness direction. Such a gas discharge passage 40 is formed by half-etching the insulation layer 22 to form the groove 28 in the step shown in FIG. 4A, and then performing the steps shown in FIGS. 4B to 4E and 6A as in the first embodiment. By forming the groove 28 by, for example, a wet isotropic etching, a gas discharge passage having a semicircular cross sectional shape is formed as shown in FIG. 13.

Figure 14:
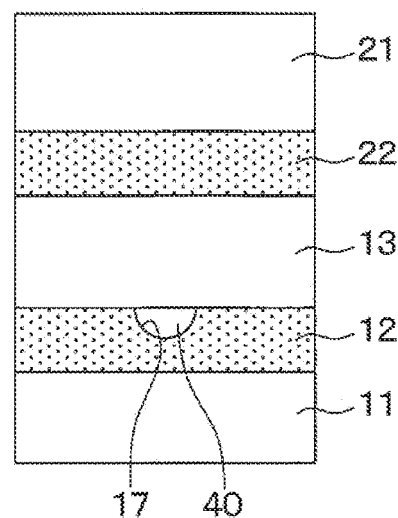
FIG. 14 is a cross-sectional view showing the manufacturing process of the semiconductor device in another embodiment, which is a diagram corresponding to FIG. 7.

Further, as shown in FIG. 14, a gas discharge passage 40 similar to that of FIG. 13 may be formed between the insulation layer 12 and the activation layer 13. Such a gas discharge passage 40 is formed by performing a half etching process on the insulation layer 12 using a mask (not shown) after the step shown in FIG. 3B and performing the step shown in FIG. 3C.

Figure 15:
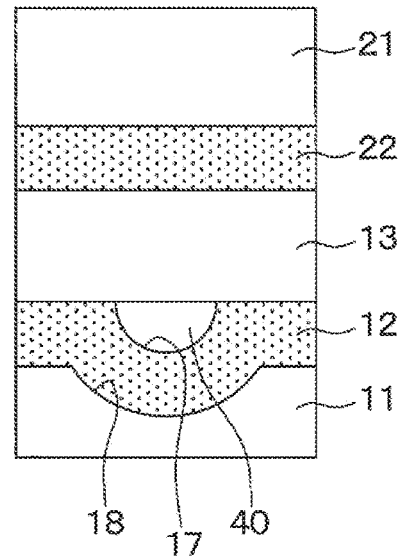
FIG. 15 is a cross-sectional view showing the manufacturing process of the semiconductor device in another embodiment, which is a diagram corresponding to FIG. 7.

Further, as shown in FIG. 15, a gas discharge passage 40 similar to that of the second embodiment may be formed in the sensor unit 10. That is, the groove portion 18 having a semicircular cross section may be formed on the surface of the support layer 11, and the gas discharge passage 40 may be formed by the space surrounded by the insulation layer 12 and the activation layer 13 formed inside the groove 18. In the gas discharge passage 40, after the step shown in FIG. 3A, a groove 18 is formed in a portion of the support layer 11 outside the recess 14 by isotropic etching using a mask (not shown), and then by performing the steps shown in FIG. 3C.

Figure 16:
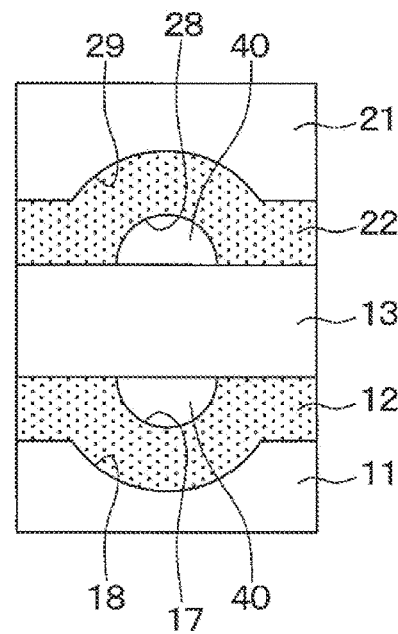
FIG. 16 is a cross-sectional view showing the manufacturing process of the semiconductor device according to the second embodiment, which is a diagram corresponding to FIG. 7.

In addition, as shown in FIG. 16, both of the gas discharge passage 40 surrounded by the insulation layer 22 and the activation layer 13 formed in the groove 29, and the gas discharge passage 40 surrounded by the insulation layer 12 and the activation layer 13 formed in the groove 18 may be formed.

Figure 17:
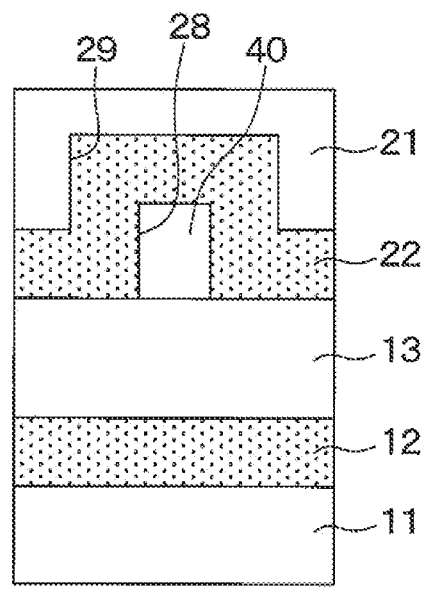
FIG. 17 is a cross-sectional view showing the manufacturing process of the semiconductor device in another embodiment, which is a diagram corresponding to FIG. 7.

Further, in the second embodiment described above, the cross section of the gas discharge passage 40 has a semicircular shape, alternatively, the cross section of the gas discharge passage 40 may have another shape. For example, the anisotropic etching such as RIE may be performed to form the groove 29 and the gas discharge passage 40 each having a rectangular cross section as shown in FIG. 17.

Figure 18:
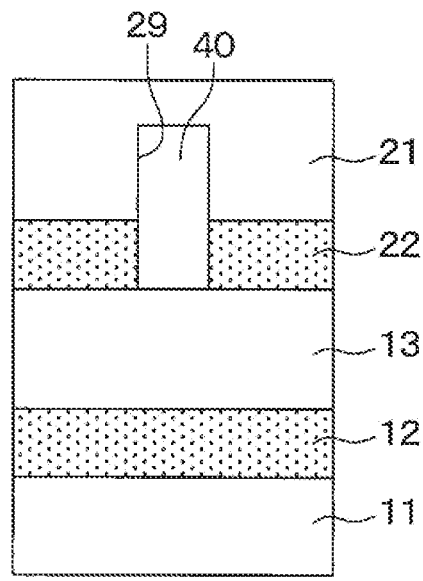
FIG. 18 is a cross-sectional view showing the manufacturing process of the semiconductor device according to another embodiment, which is a diagram corresponding to FIG. 7.

Further, as shown in FIG. 18, the gas discharge passage 40 may be configured only by the groove 29 formed in the substrate 21, and the insulation layer 22 may not be present at that position. Of course, the gas discharge passage 40 may be formed only by the groove formed on the support layer 11 side, and the insulation layer 12 may not be arranged at that position.

Figure 19:
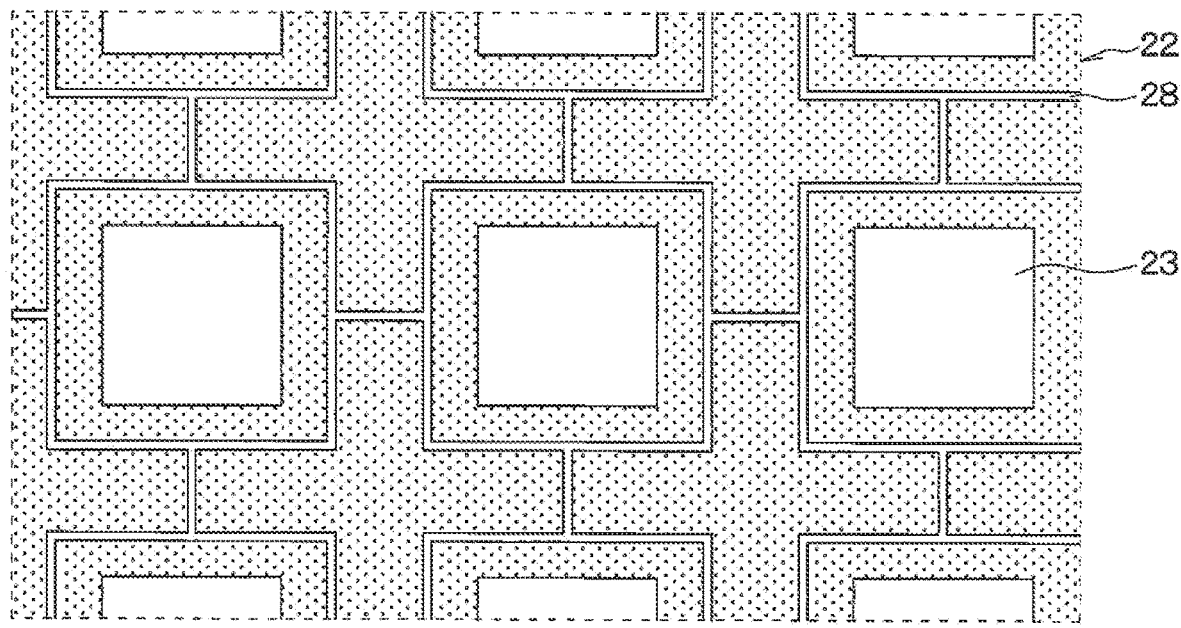
FIG. 19 is a plan view of an insulation layer according to another embodiment.

Further, as shown in FIG. 19, the groove 28 may be configured by a rectangular groove that surrounds each recess 23 and a linear groove that connects adjacent rectangular grooves.

Further, in FIG. 5 and FIG. 19, the groove 28 may be formed in the shape of a rectangular frame so as to surround each recess 23 entirely, alternatively, it is not necessary to surround each recess 23 entirely. The groove 28 may be formed in a U shape facing the three sides of each recess 23.

Further, in addition to or instead of the support layer 11 and the substrate 21, the gas discharge passage 40 may be formed by forming a groove in the activation layer 13.

Further, since the residual gas can be discharged to the outside of the wafer through the gas discharge passage 40 described in the above-described other embodiments, the annealing process in an oxygen atmosphere may be performed as necessary, and the same effect can be obtained without performing the annealing.

Further, the sensor unit 10 may have a normal SOI structure in which no cavity is formed. In this case, a part of the insulation layer 12 is removed by etching when forming the element portion 15, so that a space is formed below the element portion 15 and the element portion 15 can be displaceable. The SiO$_2$ film is not formed on the portion of the wall surface of the space 30 that is configured by the sensor unit 10, and the space surrounded by the recess 23 and the space formed by etching when the element portion 15 is formed provide the space 30.

In the first and second embodiments, the semiconductor device including a plurality of insulation layers used for the bonding of the Si substrates has been described. Alternatively, the present disclosure may be applied to a semiconductor device including only one such insulation layer. Further, the present disclosure may be applied to a semiconductor device other than the sensor. Further, the sensor may be a capacitance type acceleration sensor that detects acceleration based on a change in capacitance, or a vibration type angular velocity sensor that vibrates the element portion 15 to detect an applied angular velocity. These are merely examples, and the present disclosure may be applied to other physical quantity sensors, for example, a vibration type acceleration sensor that vibrates the element portion 15 to detect the applied acceleration.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor device having a space therein, comprising:
  a support layer made of silicon;
  an activation layer made of silicon, having an element portion, and bonded to the support layer via a first silicon oxide film layer; and
  a cap portion made of silicon, bonded to the activation layer via a second silicon oxide film layer, and having a recess disposed at a position corresponding to the element portion, wherein:
  the support layer, the first silicon oxide film layer, the activation layer, the second silicon oxide film layer, and the cap portion provide a stacking structure, and the recess provides the space inside the stacking structure, the semiconductor device further comprising:
  a gas discharge passage only arranged in one of the first silicon oxide film layer sandwiched between the support layer and the activation layer and the second silicon oxide film layer sandwiched between the activation layer and the cap portion, surrounding the space, and reaching an outer periphery of the activation layer, wherein:
  the gas discharge passage is provided by a hole arranged in one of the first silicon oxide film layer and the second silicon oxide film layer; and
  the hole is sealed in a thickness direction cross-section of the stacking structure.

2. The semiconductor device according to claim 1, wherein:
  the space has a pressure therein equal to or less than 100 Pa and equal to or larger than 10 Pa.

3. A semiconductor device having a space therein, comprising:
  a support layer made of silicon;
  an activation layer made of silicon, having an element portion, and bonded to the support layer via a first silicon oxide film layer; and
  a cap portion made of silicon, bonded to the activation layer via a second silicon oxide film layer, and having a recess disposed at a position corresponding to the element portion, wherein:
  the support layer, the first silicon oxide film layer, the activation layer, the second silicon oxide film layer, and the cap portion provide a stacking structure, and the recess provides the space inside the stacking structure, the semiconductor device further comprising:
  a gas discharge passage only arranged in one of the first silicon oxide film layer sandwiched between the support layer and the activation layer and the second silicon oxide film layer sandwiched between the activation layer and the cap portion, surrounding the space, and reaching an outer periphery of the activation layer, wherein:
  the gas discharge passage is arranged in the first silicon oxide film layer;
  the support layer and the activation layer are exposed from the first silicon oxide film layer at a position where the gas discharge passage is arranged;
  the gas discharge passage is provided by a hole surrounded by the support layer, the activation layer and the first silicon oxide film layer;
  the hole is arranged in the first silicon oxide film layer;
  a height of the hole is equal to a thickness of the first silicon oxide film layer; and
  the hole is sealed in a thickness direction cross-section of the stacking structure.

4. A semiconductor device having a space therein, comprising:
  a support layer made of silicon;
  an activation layer made of silicon, having an element portion, and bonded to the support layer via a first silicon oxide film layer; and a cap portion made of silicon, bonded to the activation layer via a second silicon oxide film layer, and having a recess disposed at a position corresponding to the element portion, wherein:

the support layer, the first silicon oxide film layer, the activation layer, the second silicon oxide film layer, and the cap portion provide a stacking structure, and the recess provides the space inside the stacking structure, the semiconductor device further comprising:

a gas discharge passage only arranged in one of the first silicon oxide film layer sandwiched between the support layer and the activation layer and the second silicon oxide film layer sandwiched between the activation layer and the cap portion, surrounding the space, and reaching an outer periphery of the activation layer, wherein:

the gas discharge passage is arranged in the second silicon oxide film layer;

the cap portion and the activation layer are exposed from the second silicon oxide film layer at a position where the gas discharge passage is arranged;

the gas discharge passage is provided by a hole surrounded by the cap portion, the activation layer and the second silicon oxide film layer;

the hole is arranged in the second silicon oxide film layer;

a height of the hole is equal to a thickness of the second silicon oxide film layer; and the hole is sealed in a thickness direction cross-section of the stacking structure.

5. A semiconductor device having a space therein, comprising:

a support layer made of silicon;

an activation layer made of silicon, having an element portion, and bonded to the support layer via a first silicon oxide film layer; and a cap portion made of silicon, bonded to the activation layer via a second silicon oxide film layer, and having a recess disposed at a position corresponding to the element portion, wherein:

the support layer, the first silicon oxide film layer, the activation layer, the second silicon oxide film layer, and the cap portion provide a stacking structure, and the recess provides the space inside the stacking structure, the semiconductor device further comprising:

a gas discharge passage only arranged in one of the first silicon oxide film layer sandwiched between the support layer and the activation layer and the second silicon oxide film layer sandwiched between the activation layer and the cap portion, surrounding the space, and reaching an outer periphery of the activation layer, wherein:

the gas discharge passage is arranged in the first silicon oxide film layer;

the first silicon oxide film layer covers the support layer and the activation layer at a position where the gas discharge passage is arranged;

the gas discharge passage is arranged at a position spaced apart from the support layer and the activation layer;

the gas discharge passage is provided by a hole arranged in the first silicon oxide film layer;

a height of the hole is smaller than a thickness of the first silicon oxide film layer; and the hole is surrounded by the first silicon oxide film layer and sealed in a thickness direction cross-section of the stacking structure.

6. A semiconductor device having a space therein, comprising:

a support layer made of silicon;

an activation layer made of silicon, having an element portion, and bonded to the support layer via a first silicon oxide film layer; and a cap portion made of silicon, bonded to the activation layer via a second silicon oxide film layer, and having a recess disposed at a position corresponding to the element portion, wherein:

the support layer, the first silicon oxide film layer, the activation layer, the second silicon oxide film layer, and the cap portion provide a stacking structure, and the recess provides the space inside the stacking structure, the semiconductor device further comprising:

a gas discharge passage only arranged in one of the first silicon oxide film layer sandwiched between the support layer and the activation layer and the second silicon oxide film layer sandwiched between the activation layer and the cap portion, surrounding the space, and reaching an outer periphery of the activation layer, wherein:

the gas discharge passage is arranged in the second silicon oxide film layer;

the second silicon oxide film layer covers the cap portion and the activation layer at a position where the gas discharge passage is arranged;

the gas discharge passage is arranged at a position spaced apart from the cap portion the activation layer;

the gas discharge passage is provided by a hole arranged in the second silicon oxide film layer;

a height of the hole is smaller than a thickness of the second silicon oxide film layer; and the hole is surrounded by the second silicon oxide film layer and sealed in a thickness direction cross-section of the stacking structure.

7. A semiconductor device having a space therein, comprising:

a support layer made of silicon;

an activation layer made of silicon, having an element portion, and bonded to the support layer via a first silicon oxide film layer; and a cap portion made of silicon, bonded to the activation layer via a second silicon oxide film layer, and having a recess disposed at a position corresponding to the element portion, wherein:

the support layer, the first silicon oxide film layer, the activation layer, the second silicon oxide film layer, and the cap portion provide a stacking structure, and the recess provides the space inside the stacking structure, the semiconductor device further comprising:

a gas discharge passage only arranged in one of the first silicon oxide film layer sandwiched between the support layer and the activation layer and the second silicon oxide film layer sandwiched between the activation layer and the cap portion, surrounding the space, and reaching an outer periphery of the activation layer, wherein:

the recess includes a plurality of recess portions;

the gas discharge passage surrounds an outer periphery of each recess portion when viewing from a top view; and a part of the gas discharge passage surrounding one recess portion is connected to another part of the gas discharge passage surrounding an adjacent one recess portion.

* * * * *